United States Patent
Cornejo et al.

(10) Patent No.: US 8,616,024 B2
(45) Date of Patent: *Dec. 31, 2013

(54) METHODS FOR FORMING GROOVES AND SEPARATING STRENGTHENED GLASS SUBSTRATE SHEETS

(75) Inventors: Ivan A Cornejo, Corning, NY (US); Gregory Scott Glaesemann, Corning, NY (US); Sinue Gomez, Corning, NY (US); Lisa Anne Moore, Corning, NY (US); Sergio Tsuda, Horseheads, NY (US); Michael Henry Wasilewski, Corning, NY (US)

(73) Assignee: Corning Incorporated, Corning, NY (US)

( * ) Notice: Subject to any disclaimer, the term of this patent is extended or adjusted under 35 U.S.C. 154(b) by 207 days.

This patent is subject to a terminal disclaimer.

(21) Appl. No.: 13/304,811

(22) Filed: Nov. 28, 2011

(65) Prior Publication Data

US 2012/0135177 A1    May 31, 2012

Related U.S. Application Data

(60) Provisional application No. 61/418,101, filed on Nov. 30, 2010.

(51) Int. Cl.
*C03B 33/023* (2006.01)
*C03B 15/00* (2006.01)

(52) U.S. Cl.
USPC .......... 65/105; 65/61; 65/112; 65/30.14; 219/121.57; 219/121.72; 219/121.85

(58) Field of Classification Search
USPC .......... 65/61, 105, 112, 30.14, 30.13; 219/121.6, 121.67–121.71, 121.85
See application file for complete search history.

(56) References Cited

U.S. PATENT DOCUMENTS

| | | | |
|---|---|---|---|
| 4,416,930 A | * | 11/1983 | Kelly .................... 428/137 |
| 4,468,534 A | | 8/1984 | Boddicker |

(Continued)

FOREIGN PATENT DOCUMENTS

| | | |
|---|---|---|
| GB | 1222182 | 1/1969 |
| JP | 63248730 A | * 10/1988 |

(Continued)

OTHER PUBLICATIONS

U.S. Appl. No. 13/304,955, filed Nov. 28, 2011, Flaesemann, Gregory Scott, et al.

(Continued)

*Primary Examiner* — Jason L Lazorcik
(74) *Attorney, Agent, or Firm* — Robert P. Santandrea

(57) ABSTRACT

Methods for separating strengthened glass articles from glass substrate sheets and strengthened glass substrate sheets are described herein. In one embodiment, a method of separating a glass article from a glass substrate sheet includes forming at least one groove on at least one surface of the glass substrate sheet. The at least one groove continuously extends around a perimeter of the glass article and extends partially through a thickness of the glass substrate sheet. The method further includes strengthening the glass substrate sheet by a strengthening process and separating the glass article from the glass substrate sheet along the at least one groove such that one or more edges of the glass article are under compressive stress. In another embodiment, a strengthened glass substrate sheet includes an ion exchanged glass having one or more grooves in one or more strengthened surface layers, the one or more grooves defining glass articles.

25 Claims, 7 Drawing Sheets

(56) References Cited

U.S. PATENT DOCUMENTS

| | | | | |
|---|---|---|---|---|
| 4,702,042 | A * | 10/1987 | Herrington et al. | 451/40 |
| 5,669,951 | A * | 9/1997 | Eichhorn | 65/60.1 |
| 6,255,621 | B1 * | 7/2001 | Lundquist et al. | 219/121.72 |
| 6,634,186 | B2 * | 10/2003 | Abe | 65/105 |
| RE39,001 | E * | 3/2006 | Lundquist et al. | 219/121.72 |
| 8,393,175 | B2 * | 3/2013 | Kohli et al. | 65/30.14 |
| 2002/0041946 | A1 * | 4/2002 | Abe | 428/64.2 |
| 2005/0221044 | A1 * | 10/2005 | Gaume et al. | 428/43 |
| 2008/0128953 | A1 | 6/2008 | Nagai et al. | |
| 2010/0206008 | A1 | 8/2010 | Harvey et al. | |
| 2010/0210442 | A1 | 8/2010 | Abramov et al. | |
| 2010/0326972 | A1 * | 12/2010 | Li et al. | 219/121.69 |
| 2011/0003619 | A1 * | 1/2011 | Fujii | 455/566 |
| 2011/0019354 | A1 * | 1/2011 | Prest et al. | 361/679.21 |
| 2011/0049765 | A1 | 3/2011 | Li et al. | |
| 2012/0052252 | A1 * | 3/2012 | Kohli et al. | 428/174 |
| 2012/0135177 | A1 * | 5/2012 | Cornejo et al. | 428/43 |
| 2012/0135195 | A1 * | 5/2012 | Glaesemann et al. | 428/156 |
| 2012/0214004 | A1 * | 8/2012 | Hashimoto et al. | 428/428 |
| 2012/0329525 | A1 * | 12/2012 | Hashimoto et al. | 455/566 |
| 2013/0037308 | A1 * | 2/2013 | Wang et al. | 174/250 |
| 2013/0192305 | A1 * | 8/2013 | Black et al. | 65/30.14 |

FOREIGN PATENT DOCUMENTS

| | | | |
|---|---|---|---|
| JP | 2004083378 A | | 3/2004 |
| JP | 2004352535 A | | 12/2004 |
| JP | 2008007360 A | | 1/2008 |
| JP | 2008007384 A | | 1/2008 |
| JP | 2008247732 | | 10/2008 |
| JP | 2011164508 A | * | 8/2011 |
| WO | WO2008108332 A1 | | 12/2008 |

OTHER PUBLICATIONS

U.S. Appl. No. 13/387,790, filed Jan. 30, 2012, Gomez, Sinue, et al.

* cited by examiner

METHODS FOR FORMING GROOVES AND SEPARATING STRENGTHENED GLASS SUBSTRATE SHEETS

CROSS-REFERENCE TO RELATED APPLICATIONS

This application claims the benefit of priority under 35 U.S.C. §119 of U.S. Provisional Application Ser. No. 61/418,101, filed on Nov. 30, 2010, the content of which is relied upon and incorporated herein by reference in its entirety.

BACKGROUND

1. Field

The present specification generally relates to separating glass substrate sheets and, more particularly, to forming grooves within a strengthened glass substrate sheet prior to a strengthening process in order to separate glass articles from strengthened glass substrate sheets.

2. Technical Background

Thin glass articles have a variety of applications in consumer electronic devices. For example, such glass articles may be used as cover sheets and/or touch screens for LCD and LED displays incorporated in mobile telephones, GPS devices, display devices such as televisions and computer monitors, and various other electronic devices. As the use of glass articles in various devices continues to expand, the geometric complexity of the glass articles also increases. For example, certain applications may require that the glass articles be formed with complex shapes, such as curved peripheries and/or through-features, thus requiring additional machining operations to achieve the desired geometry.

The glass articles may be formed by separating a glass substrate sheet into a plurality of discrete glass articles. In addition, the glass substrate sheet may be formed from damage resistant glass, such as ion-exchanged glass or similarly strengthened glass. For example, the ion-exchange process creates a compressive stress at the surfaces of the glass substrate. These compressive stresses extend from the surfaces of the glass substrate to a certain depth, referred to as the depth of layer. The compressive stresses are balanced by a central layer or region of tensile stresses (referred to as central tension) such that the net stress in the glass substrate is zero. The formation of compressive stresses at the surface of the glass substrate makes the glass strong and resistant to mechanical damage and, as such, mitigates catastrophic failure of the glass substrate by preventing flaws originating at the surface from propagating through the depth of layer.

However, strengthened glass articles are susceptible to edge damage, especially after the glass articles are separated from a glass substrate sheet after the strengthening process has been performed. When glass articles are ion exchanged after separation, both the surface and edges are strengthened and damage resistant. However, there is the case where it is desirable to separate the glass sheet into individual articles after the ion exchange process. In this case, the newly formed edges have not been ion exchanged and are susceptible to damage from mechanical contact. More specifically, separating the glass substrate after ion-exchange processing leaves the central tension layer exposed at the edges of the separated glass article, thereby leaving the edge susceptible to damage that may lead to catastrophic failure of the article.

SUMMARY

In one embodiment, a method of separating a glass article from a glass substrate sheet includes forming at least one groove on at least one surface of the glass substrate sheet. The at least one groove continuously extends around a perimeter of the glass article and partially extends through a thickness of the glass substrate sheet. The method further includes strengthening the glass substrate sheet by a strengthening process and separating the glass article from the glass substrate sheet along the at least one groove such that one or more edges of the glass article are under compressive stress.

In another embodiment, a method of separating a glass article from a glass substrate sheet includes positioning the glass substrate sheet on a bottom mold, positioning a top mold on the glass substrate sheet, wherein at least one of the top mold or the bottom mold comprises a ridge section configured to form the at least one groove. The method further includes applying a force to at least one of the top mold or the bottom mold, heating the top mold, the bottom mold, and the glass substrate sheet, and cooling the top mold, the bottom mold, and the glass substrate sheet. The glass substrate is removed from the top and bottom molds. The glass substrate sheet has at least one V-shaped groove on at least one surface of the glass substrate sheet that continuously extends around a perimeter of a glass article and extends partially through a thickness of the glass substrate sheet. The method further includes strengthening the glass substrate sheet by an ion-exchange strengthening process and separating the glass article from the glass substrate sheet along the at least one groove such that one or more edges of the glass article are under compressive stress.

In yet another embodiment, a strengthened glass substrate sheet includes an ion-exchanged glass having a first strengthened surface layer of a first surface and a second strengthened surface layer of a second surface under a compressive stress and extending from the first and second surfaces to a depth of layer, and a central region between the first strengthened surface layer and the second strengthened surface layer that is under tensile stress. The strengthened glass substrate sheet further includes at least one groove within the first strengthened surface layer, the second strengthened layer or both. The at least one groove continuously extends around a perimeter of a glass article to be separated from the strengthened glass substrate sheet, defines the glass article, and extends partially through a thickness of the glass substrate sheet.

Additional features and advantages of the claimed subject matter will be set forth in the detailed description which follows, and in part, will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference will now be made in detail to various embodiments of methods for grooving and separating strengthened glass substrate sheets. FIGS. 1A-7E schematically depict various embodiments of methods for separating one or more strengthened glass articles from a strengthened glass substrate sheet by the formation of grooves. In one embodiment, the method generally comprises forming a groove within a non-strengthened glass substrate sheet. The groove is continuous and defines a perimeter of the glass article that will be separated from the glass substrate sheet. The groove extends partially through the thickness of the glass substrate sheet. After the groove (or grooves) is formed, the glass substrate sheet is strengthened by strengthening process, such as an ion-exchange strengthening process. The strengthening process creates a compressive stress region on both surfaces, as well as the edges, of the glass article. The glass article is then separated from the now strengthened glass substrate sheet by severing the strengthened glass substrate sheet along the grooves. Methods for separating glass articles from strengthened glass substrate sheets as well as pre-grooved strengthened glass substrate sheets will be described in further detail herein with specific reference to the appended figures.

Figure 1A:
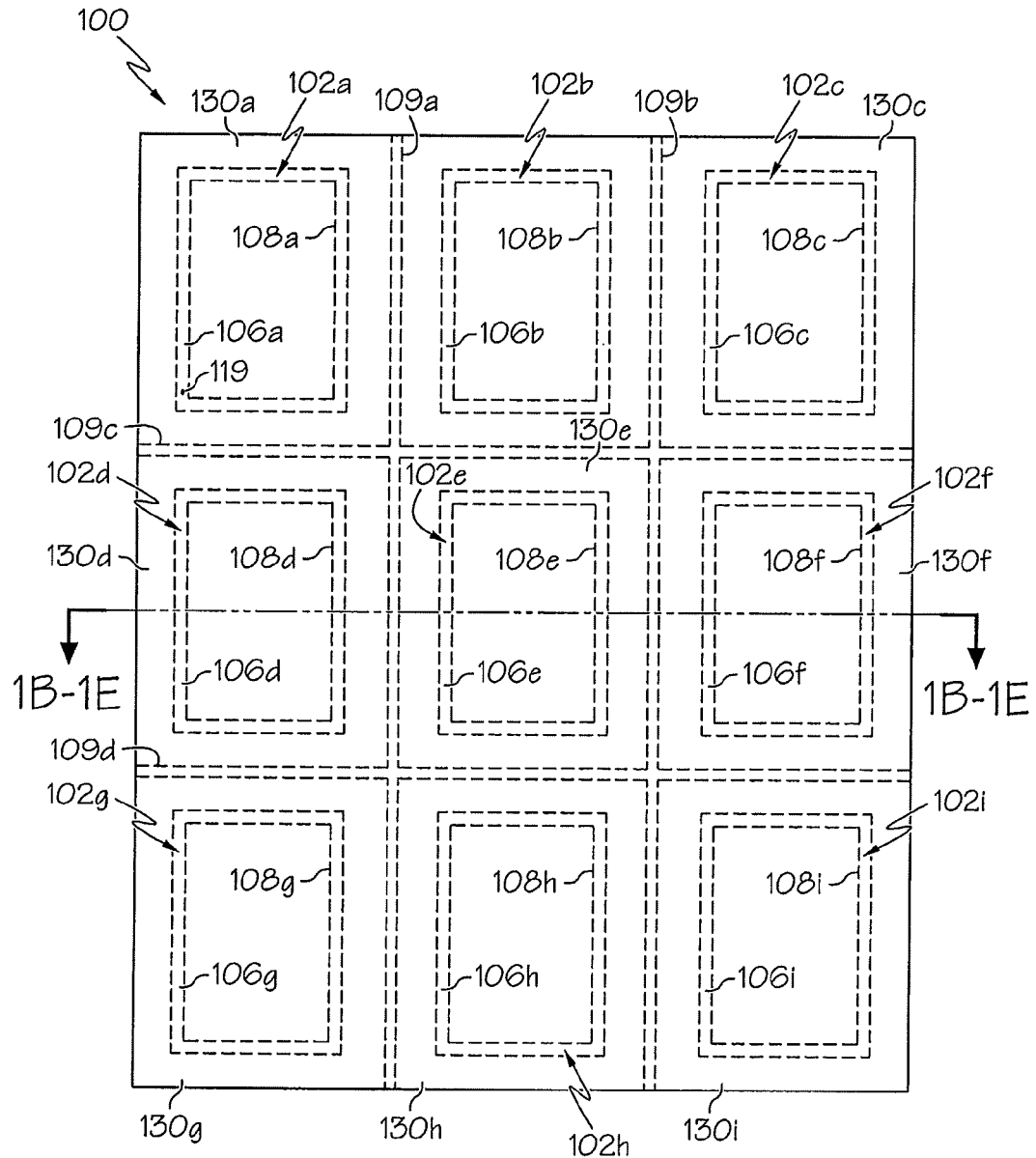
FIG. 1A schematically depicts a glass substrate sheet having a plurality of grooves defining a plurality of glass articles according to one or more embodiments shown and described herein.

Referring now to FIG. 1A, one embodiment of a method for separating a strengthened glass article 102 from a glass substrate sheet 100 is schematically depicted. In some embodiments described herein, the glass substrate sheet generally may have a thickness of 0.2 mm or greater. In other embodiments, the glass substrate sheet 100 may have a thickness from about 0.5 mm to about 1.5 mm. However, it should be understood that the techniques described herein may also be used in conjunction with glass substrate sheets having thicknesses less than 0.5 mm or greater than 1.5 mm. The glass substrate sheet 100 may be formed from alkali silicate glasses which are susceptible to chemical strengthening, such as, for example, alkali-aluminosilicate glasses. However, in the method for extracting a strengthened glass article from a glass substrate sheet schematically depicted in FIGS. 1A-1F, it should be understood that the glass substrate sheet is initially in an un-strengthened condition (i.e., prior to chemical strengthening).

In one embodiment, the alkali aluminosilicate glass comprises alumina, at least one alkali metal and, in some embodiments, greater than 50 mol %, $SiO_2$, in other embodiments, at least 58 mol %, and in still other embodiments, at least 60 mol % $SiO_2$, wherein the ratio $$\frac{Al_2O_3 (\text{mol \%}) + B_2O_3 \ (\text{mol \%})}{\sum \text{alkali metal modifiers (mol \%)}} > 1,$$

where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio $$\frac{Al_2O_3 (\text{mol \%}) + B_2O_3 \ (\text{mol \%})}{\sum \text{alkali metal modifiers (mol \%)}} > 1,$$

where the modifiers are alkali metal oxides. In another embodiment, the alkali aluminosilicate glass comprises, consists essentially of, or consists of: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO. In yet another embodiment, the alkali aluminosilicate glass substrate comprises, consists essentially of, or consists of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O+Na_2O+K_2O$≤20 mol % and 0 mol %≤$MgO+CaO$≤10 mol %. In still another embodiment, the alkali aluminosilicate glass comprises, consists essentially of, or consists of: about 64 mol % to about 68 mol % $SiO_2$; about 12 mol % to about 16 mol % $Na_2O$; about 8 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2+B_2O_3+CaO$≤69 mol %; $Na_2O+K_2O+B_2O_3+MgO+CaO+SrO$>10 mol %; 5 mol %≤$MgO+CaO+SrO$≤8 mol %; $(Na_2O+B_2O_3)-Al_2O_3$≤2 mol %; 2 mol %≤$Na_2O-Al_2O_3$≤6 mol %; and 4 mol %≤$(Na_2O+K_2O)-Al_2O_3$≤10 mol %.

In some embodiments, the alkali aluminosilicate glass is free of lithium, whereas in other embodiments, such glasses are free of at least one of arsenic, antimony, and barium. In some embodiments, the substrate is down-drawn, using methods such as, but not limited to fusion-drawing, slot-drawing, re-drawing, and the like.

Referring to FIG. 1A, a glass substrate sheet 100 having a plurality of pre-separated glass articles 102a-i defined therein is illustrated. As shown in FIG. 1A, the glass articles 102a-i that are to be separated from the glass substrate sheet 100 are arranged in an array. It should be understood that in some embodiments, only one glass article 102 may be separated from the glass substrate sheet, or the glass articles may be arranged in a different pattern than that depicted in FIG. 1A. The arrangement and number of glass articles 102a-i is for illustration purposes only. For example, the glass articles may be arranged within the glass substrate sheet 100 such that each glass article shares one or more grooves with adjacent glass articles. In this manner, one groove or portion of a groove may create an edge for a first glass article and an edge for a second glass article after separation from the glass substrate sheet.

FIG. 1A depicts a first surface 101 (e.g., the top surface) of the glass substrate sheet 100. Formed within the first surface 101 of the glass substrate sheet 100 are a plurality of continuous first grooves 106a-i that define a perimeter 108a-i of glass articles 102a-i, respectively. In this manner, the first grooves outline the glass articles or parts that will be separated from the glass substrate sheet after a strengthening process.

Figure 1B:
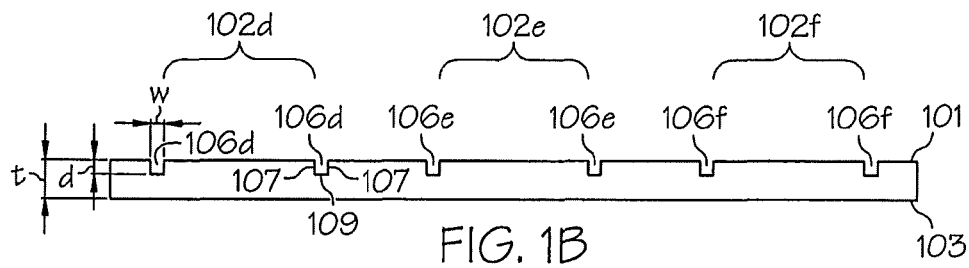
FIG. 1B schematically depicts a cross section of a glass substrate sheet having one-sided U-shaped grooves according to one or more embodiments shown and described herein.

FIGS. 1B-1E illustrate cross-sections of a glass substrate sheet 100 (e.g., the glass substrate sheet depicted in FIG. 1A), and show various groove configurations according to some embodiments of the present disclosure. FIG. 1B illustrates U-shaped grooves 106d-f formed on a single surface (first surface 101) of the glass substrate sheet 100. The grooves 106d-f have nearly-vertical walls 107 and a relatively flat central region 109. The grooves 106d-f extend a groove depth d into the thickness t of the glass substrate sheet 100 at a groove width w. The groove depth d may depend on the overall thickness t and other properties of the glass substrate sheet. In one embodiment, the groove depth d may be between about 250 μm and about 750 μm in a 1 mm thick Corning® Code 2317 glass substrate sheet. It should be understood that other groove depths may be utilized. The groove width w may also depend on the particular type of glass substrate sheet as well as the limitations of the method that is used to form the grooves into the glass substrate sheet. In one embodiment, the groove width w may be between about 0.10 mm and 1 mm.

Figure 1C:
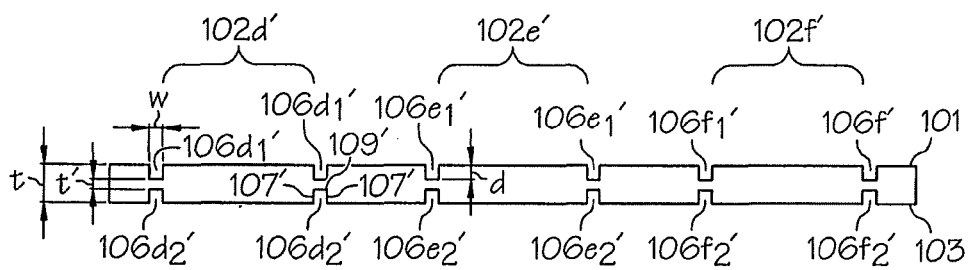
FIG. 1C schematically depicts a cross section of a glass substrate sheet having two-sided U-shaped grooves according to one or more embodiments shown and described herein.

FIG. 1C illustrates an embodiment in which U-shaped grooves are formed on both the first surface 101 and the second surface 103 of the glass substrate sheet 100. U-shaped grooves $106d_1'$-$106f_1'$ are formed on the first surface 101 (i.e., first grooves), and U-shaped grooves $106d_2'$-$106f_2'$ are formed on the second surface 103 of the glass substrate sheet 100 (i.e., second grooves). The grooves $106d'$-$f'$ have nearly-vertical walls 107' and a relatively flat central region 109'. The U-shaped first grooves $106d_1'$-$106f_1'$ formed on the first surface 101 of glass substrate sheet 100 vertically align with the U-shaped second grooves $106d_2'$-$106f_2'$ formed on the second surface 103 of the glass substrate sheet 100. Referring once again to FIG. 1A, although not shown, a plurality of continuous grooves are formed within the bottom surface of the glass substrate sheet that are vertically aligned with the grooves 106a-i formed on the top surface 101.

Each of the U-shaped grooves extends through the thickness t of the glass substrate sheet 100 to a groove depth d and a groove width w. The glass substrate sheet 100 has a groove thickness t' between each of the U-shaped grooves. For example, the glass substrate material has a groove material thickness t' between groove $106d_1'$ and groove $106d_2'$. As stated above with respect to the single-sided groove embodiment, the groove depth d and groove width w may depend on the overall thickness t and other properties of the glass substrate sheet 100. In one embodiment, the groove depth d is about 250 μm in a 1 mm thick glass substrate sheet with a groove material thickness t' of about 500 μm. Other groove depth d values may be used. In one embodiment, the groove width w may be between about 0.10 mm and 1 mm. As described in more detail below, generally the deeper the groove depth d and thinner the groove material thickness t', the greater the area of the edge that is strengthened.

Figure 1D:
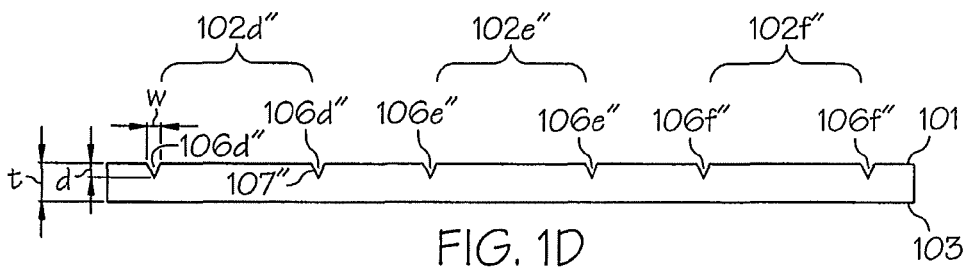
FIG. 1D schematically depicts a cross section of a glass substrate sheet having one-sided V-shaped grooves according to one or more embodiments shown and described herein.

FIG. 1D illustrates V-shaped grooves $106d''$-$f''$ formed on a single surface (first surface 101) of the glass substrate sheet. The grooves $106d''$-$f''$ have intersecting angled walls 107''. The angled walls 107'' may possess a variety of angles (e.g., 45°). As stated above with respect to the U-shaped grooves illustrated in FIG. 1B, the V-shaped grooves $106d''$-$f''$ extend a groove depth d into the thickness t of the glass substrate sheet 100 at a groove width w. The groove depth d of the V-shaped grooves $106d''$-$f''$ may also depend on the overall thickness t and other properties of the glass substrate sheet.

Figure 1E:
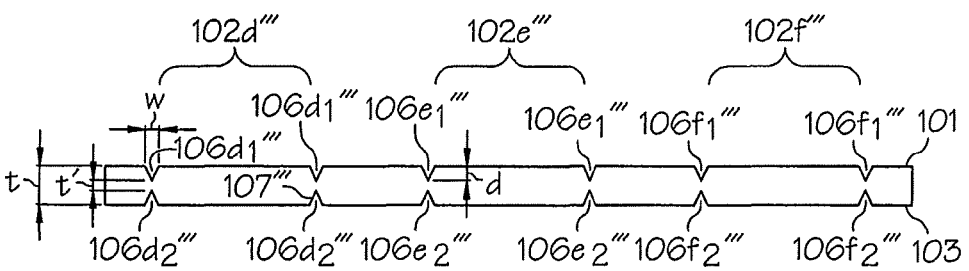
FIG. 1E schematically depicts a cross section of a glass substrate sheet having two-sided V-shaped grooves according to one or more embodiments shown and described herein.

FIG. 1E illustrates an embodiment in which V-shaped grooves are formed on both the first surface 101 and the second surface 103 of the glass substrate sheet 100. V-shaped grooves $106d_1'''$-$106f_1'''$ are formed on the first surface 101, and V-shaped grooves $106d_2'''$-$106f_2'''$ are formed on the second surface 103 of the glass substrate sheet 100. The grooves $106d'''$-$f'''$ have intersecting angled walls 107'''. The angled walls 107''' may possess a variety of angles (e.g., 45°). The V-shaped grooves formed on the first surface 101 of glass substrate sheet 100 vertically align with the V-shaped grooves formed on the second surface 103 of the glass substrate sheet 100. Each of the V-shaped grooves extends through the thickness t of the glass substrate sheet 100 at a groove depth d and a groove width w. The glass substrate sheet 100 has a groove thickness t' between each of the V-shaped grooves. For example, the glass substrate material has a groove material thickness t' between groove $106d_1'''$ and groove $106d_2'''$. The groove depth d and groove width w may depend on the overall thickness t and other properties of the glass substrate sheet 100. In one embodiment, the groove depth d is about 250 μm in a 1 mm thick glass substrate sheet with a groove material thickness t' of about 500 μm. It should be understood that other groove depth d values may be used. In one embodiment, the groove width may be between about 0.10 mm and 1 mm. It is noted that the configuration of the grooves on the first surface may be different from the configuration of the grooves on the second surface. For example, V-shaped grooves may be provided on the first surface 101 (e.g., V-shaped grooves $106d'''\text{-}f'''$ illustrated in FIG. 1D) and U-shaped grooves may be provided on the second surface (e.g., U-shaped grooves $106d\text{-}f$ illustrated in FIG. 1B).

Figure 2A:
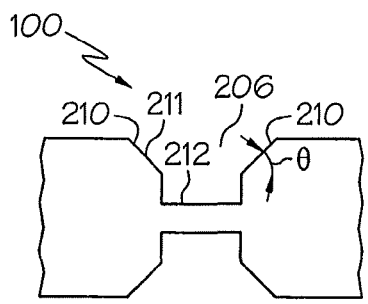
FIG. 2A schematically depicts a partial cross section of a glass substrate sheet having a two-sided chamfered groove according to one or more embodiments shown and described herein.
Figure 2B:
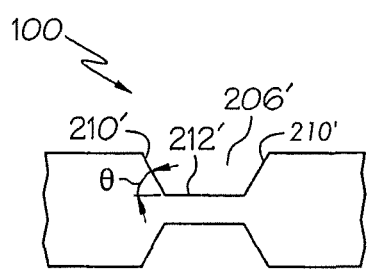
FIG. 2B schematically depicts a partial cross section of a glass substrate sheet having a two-sided beveled groove according to one or more embodiments shown and described herein.

Grooves having other configurations may also be formed within the un-strengthened glass substrate 100. The grooves may be formed in the shape of the desired edges of the glass article. For example, referring to FIG. 2A, the chamfered groove 206 may be generally U-shaped with a generally flat bottom portion 212. The chamfered sidewalls of the chamfered groove 206 may comprise an upper portion 210 orientated at an angle θ (e.g., 45°), and a lower, substantially vertical portion 211 that meets the relatively flat central portion 212. Chamfered groove 206 may enable the glass article to have a chamfered edge after separation from the glass substrate sheet 100 along the chamfered groove 206. FIG. 2B illustrates a beveled groove 206' having beveled walls 210' that are angled at an angle θ and meet at a generally flat portion 212'. The beveled groove 206' may also enable a chamfered edge after separation.

The grooves described and illustrated herein may be formed in the glass substrate sheet 100 using a variety of techniques. In one embodiment, the grooves 106 may be formed mechanically by the use of a dicing saw. As an example and not a limitation, a dicing saw was used to form straight U-shaped grooves within a single side of a 50×50×1 mm Corning® Code 2317 glass substrate sheet having groove depths d of 250 μm, 500 μm, and 750 μm. Additionally, a dicing saw was used to form double-sided grooves within a 50×50×1 mm Corning® Code 2317 glass substrate sheet having a groove depths d of 250 μm, and to form double sided grooves in a 1.3 mm thick Corning® Code 2317 glass substrate sheet at a groove depth of d=400 μm and groove widths w of 0.13, 0.27, 0.56, and 0.76 mm.

Use of a dicing saw may form the generally U-shaped grooves as illustrated in FIGS. 1B and 1C and may be limited to the formation of only straight grooves in some applications. As described in more detail below, separating the glass article along U-shaped grooves may produce a lip along the edge of the separated glass article that may need to be polished off. Polishing the edge may remove some of the ion exchange layer on the edge, which, in some applications, may be undesirable. In one embodiment, a shaped saw blade may be used to produce a more V-shaped groove that may result in no lip after separation. It is noted that use of a dicing saw may not be the preferred technique when desiring to form curved grooves, such as those illustrated in FIG. 1A.

In another embodiment, contoured, shaped grooves 106 may be formed mechanically by the use of an end mill. In still another embodiment, the grooves 106 may be formed by water jet cutting in which a jet of water or other liquid is forcibly applied to the glass substrate sheet to ablate the glass substrate sheet. The water jet cutting technique may provide the benefits of allowing for arbitrarily-shaped grooves to be formed within the glass substrate sheet and would not be subject to tool wear issues inherent with sawing or milling the glass substrate sheet. It is noted that an optional protective coating may be applied to the glass substrate sheet prior to the mechanical formation of the grooves (e.g., use of a dicing saw, end mill, and/or water-jet) to protect the glass substrate sheet from scratching or other damage during the grooving process. The optional protective coating may be an acrylic coating that is commonly applied to LCD display glass, for example.

Figure 3A:
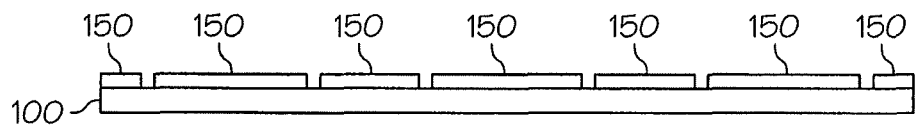
FIG. 3A schematically depicts a cross section of a glass substrate sheet having an etching mask applied thereto according to one or more embodiments shown and described herein.
Figure 3B:
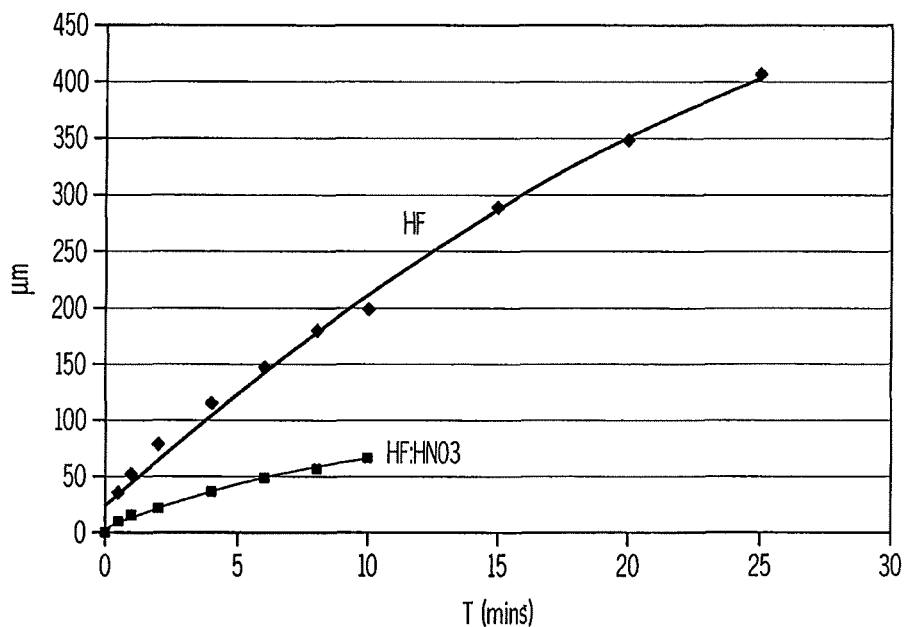
FIG. 3B graphically depicts etching times for a glass substrate sheet according to one or more embodiments shown and described herein.
Figure 3C:
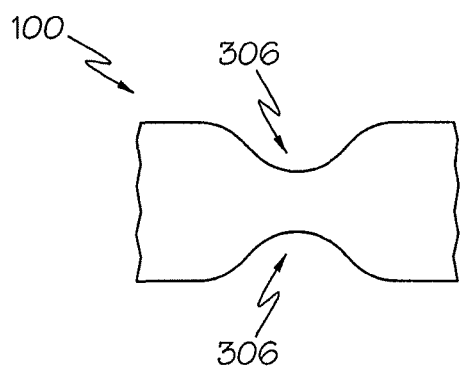
FIG. 3C schematically depicts a partial cross section of a glass substrate sheet having a two-sided, generally U-shaped groove with curved walls resulting from an etching process according to one or more embodiments shown and described herein.

In yet another embodiment, the grooves 106 may be formed by an etching process. Referring now to FIG. 3A, the areas of the glass substrate sheet 100 that are not to be grooved are masked from an etching solution using a etching mask 150 that is applied to one or both surfaces of the glass substrate sheet 100. A variety of masking materials may be utilized to prevent the etching solution from reaching the areas that are not to be grooved. FIG. 3B depicts etch rates for Corning® Code 2317 glass in concentrated HF and HF:$HNO_3$ etching solutions. As an example and not a limitation, Teflon tape was used as a masking material to mask all but a 2 mm wide line on both sides of a 1 in.×2 in.×1.3 mm Corning® Code 2317 glass substrate sheet. The masked glass substrate sheet was etched in a concentrated HF etching solution for twenty minutes, which produced a U-shaped, two-sided groove with a rounded walls (FIG. 3C). After separation, the edge would still possess a lip, but polishing the lip off or back would be less likely to remove the ion exchange layer than in the case of the square-edge groove.

Figure 4A:
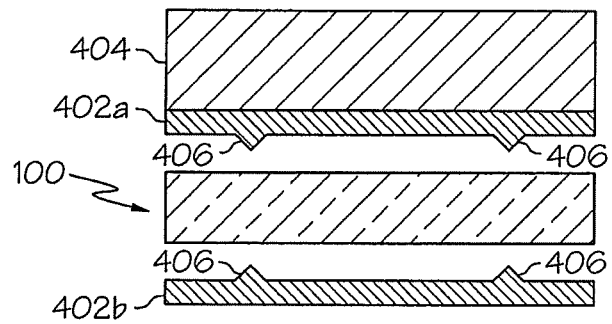
FIG. 4A schematically depicts a glass substrate sheet, a top mold, a bottom mold, and a weight for use during a hot pressing process according to one or more embodiments shown and described herein.

In still yet another embodiment, arbitrarily-shaped grooves 106 (e.g., curved grooves) may be formed within the glass substrate sheet 100 by a hot pressing method. Referring to FIG. 4A, one or more molds 402a, 402b may be applied to a glass substrate sheet 100. The molds, which in one embodiment comprise graphite molds, have ridges 406 that are configured to form the desired groove. In the embodiment illustrated in FIG. 4A, the ridges are peaked to form a V-shaped groove within the glass substrate sheet 100 (i.e., a pointed ridge mold). The ridges may take on other shapes to form different grooves, such as the beveled groove of FIG. 2B, for example. To form two-sided grooves, ridges 406 may be present on a top mold 402a and a bottom mold 402b. The ridges 406 on the top and bottom molds 402a, 402b should be vertically aligned such that the resulting grooves are aligned within the glass substrate sheet 100.

Prior to being placed in the molds 402a, 402b, the glass substrate sheet 100 may be cleansed to prevent contaminants from being impregnated into the material during the hot pressing process. In one embodiment, the glass substrate sheet 100 is cleaned by applying a cleaning agent (e.g., a detergent), rinsing the cleaning agent from the glass substrate sheet 100 with DI water, and then drying the glass substrate sheet 100 with $N_2$.

Figure 4B:
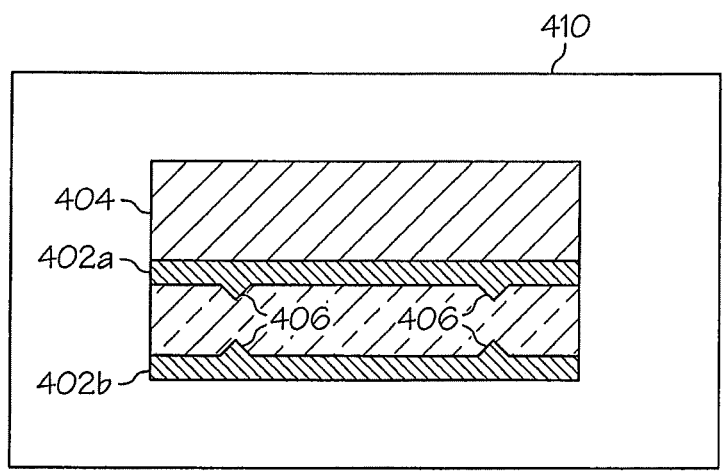
FIG. 4B schematically depicts the glass substrate sheet, the top mold, the bottom mold, and the weight illustrated in FIG. 4A positioned in a furnace during a hot pressing process according to one or more embodiments shown and described herein.

The glass substrate sheet 100 may then be placed on the bottom mold 402b, and the top mold 402a may be placed on top of the glass substrate sheet 100. A force is then applied to the glass/mold assembly. The force may be applied by placing a weight 404 to the top mold 402a as illustrated in FIG. 4B, for example. Other means of applying a force may be utilized. The mold/substrate assembly may then be subjected to thermal energy using an $N_2$-purged furnace 410 for a period of time and then cooled. In one embodiment, the $N_2$-purged furnace 410 increases the amount of thermal energy at a rate of about 10° C. per minute to a maximum temperature that is just below the softening point of the glass substrate sheet (e.g., about 25-35° below the softening point). The mold/substrate assembly is then maintained within the $N_2$-purged furnace for about 10 minutes, and then cooled to room temperate by ceasing operation of the $N_2$-purged furnace such that the mold/substrate assembly cools at the cooling rate of the furnace.

As an example and not a limitation, molds were used to press straight-line grooves across 50×50×1 mm Corning® Code 2317 glass substrate sheets using the hot pressing method described above. A 425 g piece of fused silica was placed on the top mold to provide the force, and the $N_2$-purged furnace was operated to a maximum temperature of about 810° C. The molds produced the V-shaped grooves of FIG. 4C and the beveled grooves illustrated in FIG. 1E.

Figure 5:
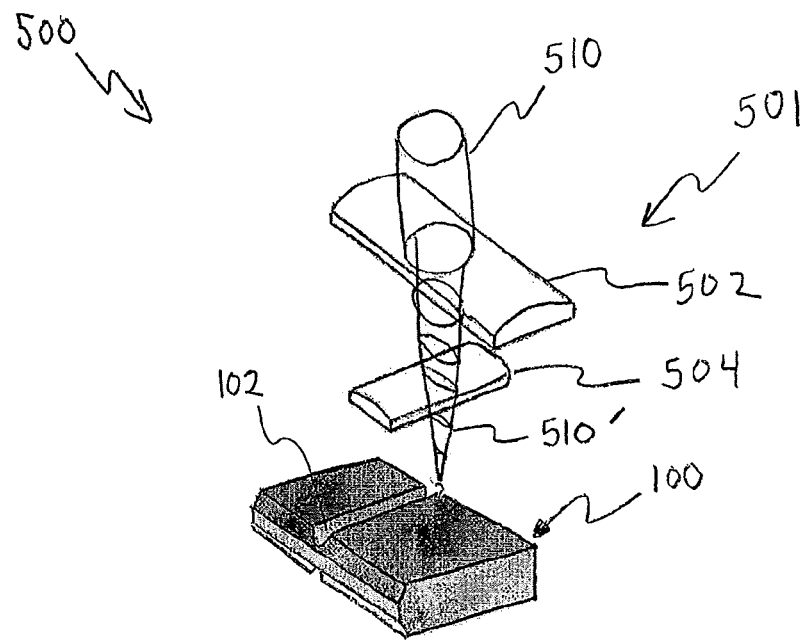
FIG. 5 schematically depicts a laser grooving system according to one or more embodiments shown and described herein.

Laser ablation may also be utilized to form grooves within the glass substrate sheet. FIG. 5 schematically illustrates a laser grooving system 500 that may form one or more grooves 106 within a glass substrate sheet 100. In one embodiment, the laser grooving system 500 comprises a laser focusing assembly 501 capable of shaping a beam profile of a laser beam 510 provided by a laser source (not shown). As an example and not a limitation, the laser source may be operable to produce a pulsed laser beam 510 having a wavelength within the spectral region of transparency of the glass substrate sheet 100. In one embodiment, the laser beam 510 is an ultra-short pulsed laser beam having pulse-widths less than 100 fs. Although in some embodiments the laser beam 510 may have a wavelength that is absorbed by the glass substrate sheet 100 (e.g., UV or $CO_2$) and longer pulses or at CW, the induced thermal effects may prevent the consistent formation of the grooves.

The laser focusing assembly 501 illustrated in FIG. 5 comprises a first cylindrical lens 502 and a second cylindrical lens 504. Each cylindrical lens has a different focal length. The first and second cylindrical lenses 502, 504 are used to transform and focus the Gaussian laser beam 510 with cylindrical symmetry into an asymmetrical intensity distribution as the focused laser beam 510' is incident on the surface of the glass substrate sheet 100. The glass substrate sheet 100 or the laser source may be translated such that the laser beam 510 traverses the surface of the glass substrate sheet 100 along a desired groove line (i.e., the region of the glass substrate sheet where the groove is to be formed).

By manipulating the focal length ratio of both lenses, it is possible to change the shape (or angle) and depth of a V-shaped groove. As described above, V-shaped grooves may be desirable to eliminate (or nearly eliminate) the formation of a lip at the edge of the glass article after separation. It is noted that other types of lenses may be utilized. For example, a spherical lens can also be used to create V-shaped grooves. However, because a spherical lens focuses on both transverse directions at the same rate, it may be more difficult to manipulate the aspect ratio than the use of cylindrical lenses.

The use of an ultra-short pulsed laser beam 510 that is transparent in the spectral region of transparency of the glass substrate sheet 100 allows for glass material removal with less impact from the presence of heat affected zones and residual stress. Because the glass material is transparent to the laser wavelength, ablation typically occurs only when the intensity is so high that it induces nonlinear optical absorption, such as multi-photon ionization, and while the laser beam is present. Since the optical pulse is ultra-short (e.g., less than 100 fs), the excitation of the glass material is short-lived and dissipates almost instantaneously (i.e., by cold ablation). For glass materials with a large coefficient of thermal expansion, laser beams having a wavelength that is transparent in the spectral region of transparency of the glass material may be preferred as the ablated region may have large defects and micro-cracks that may damage the glass substrate sheet.

The intensity distribution of the focused pulsed laser beam 510' may provide for a smooth transition line from the surface of the glass substrate sheet 100 to the adjacent chamfered surface of the edge of the separated glass article with minimal defects or micro-cracks. As described in more detail below, the grooves enable at least a portion (or all) of the edges of separated glass articles to be strengthened by a strengthening process such as ion exchange.

The laser beam 510 may be applied to a strengthened glass substrate sheet after the strengthening process rather than before in an alternative embodiment. However, if the groove formation occurs after the glass is ion-exchanged, the separated edges of the glass article may have K-enriched ion exchanged layers only at the free surface and the exposed regions of the edges may require further processing to re-create a compressive layer (e.g., by the application of ion-exchange gel or paste).

In yet another embodiment, a combination of the above-described techniques may be used. For example, an etching step may be utilized after one or more of the above techniques to minimize the size and sharpness of any surface flaws within the groove or grooves or to modify the groove shape. As an example and not a limitation, the glass substrate sheet may be dipped in a 5% HF:5% HCl mixture for about 8 to about 16 minutes to remove sharpness and surface flaws.

Figure 6A:
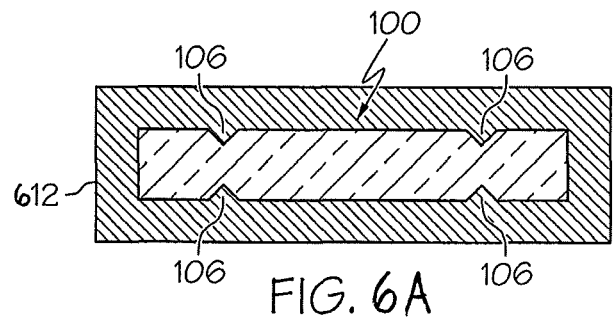
FIG. 6A schematically depicts a glass substrate sheet in an ion-exchange bath according to one or more embodiments shown and described herein.
Figure 6B:
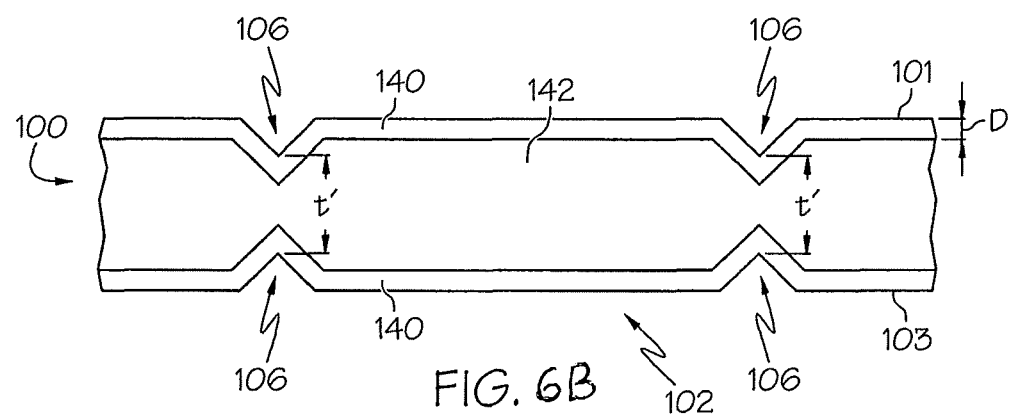
FIG. 6B schematically depicts a strengthened glass substrate sheet following a strengthening process according to one or more embodiments shown and described herein.

Referring now to FIG. 6A, after the grooves 106 have been formed in the strengthened glass substrate sheet 100 and have optionally been smoothed by an etching process, the glass substrate sheet 100 may be subjected to a strengthening process. For example, in one embodiment, the glass substrate sheet 100 is chemically strengthened by ion-exchange in which smaller sodium ions near the surface of the glass are exchanged with larger potassium ions when the glass substrate sheet 100 is placed in an ion exchange bath 412. Replacement of the smaller sodium ions with the larger potassium ions causes a layer of compressive stress to develop in the surfaces of the glass substrate sheet 100. The compressive stress extends below the surfaces of the glass substrate sheet 100 to a specified depth of layer D, as shown in FIG. 6B. For example, FIG. 6B depicts a cross section of one embodiment of the glass substrate sheet 100 after ion-exchange strengthening. A layer of compressive stress 140 extends from the top surface 101 (i.e., a first compressive surface layer) and bottom surface 103 (i.e., a second compressive surface layer) to the depth of layer D. The compressive stress 140 is balanced by the development of a layer of central tension 142 at the center of the glass substrate sheet 100.

In the embodiments described herein, the compressive stress and depth of layer developed in the glass substrate sheet 100 and resulting glass article 102 by strengthening are sufficient to improve the damage tolerance of the glass article 102 while also facilitating further processing (such as by machining or laser processing) without risk of introducing flaws into the glass article. In one embodiment, the compressive stress may be from about 200 MPa to about 1000 MPa. In another embodiment, the compressive stress may be from about 500 MPa to about 800 MPa. In yet another embodiment, the compressive stress may be from about 650 MPa to about 900 MPa. In one embodiment, the depth of layer may be from about 10 microns to about 80 microns. In another embodiment, the depth of layer may be from about 30 microns to about 60 microns. In yet another embodiment, the depth of layer D may be from about 40 microns to about 60 microns.

While specific reference has been made herein to use of an ion-exchange strengthening process in which sodium ions are replaced with potassium ions, it should be understood that the specific ion exchange process utilized to strengthen the glass substrate sheet is dependent on the composition of the glass from which the glass substrate sheet is formed. For example, other ion-exchange processes may be utilized in which different ions are exchanged in order to strengthen the glass, such as when lithium ions and/or other alkali ions are exchanged for sodium ions in the ion-exchange processes to achieve the desired compressive strength and depth of layer. Accordingly, it should be generally understood that, during ion-exchange, smaller ions in the glass are exchanged with larger ions to achieve the desired compressive stress and depth of layer. Moreover, the chemical strengthening process may be a single-ion-exchange process or an ion-exchange process in which multiple ions are exchanged to produce a complex diffusion profile (e.g., a double-ion-exchange process).

Figure 7E:
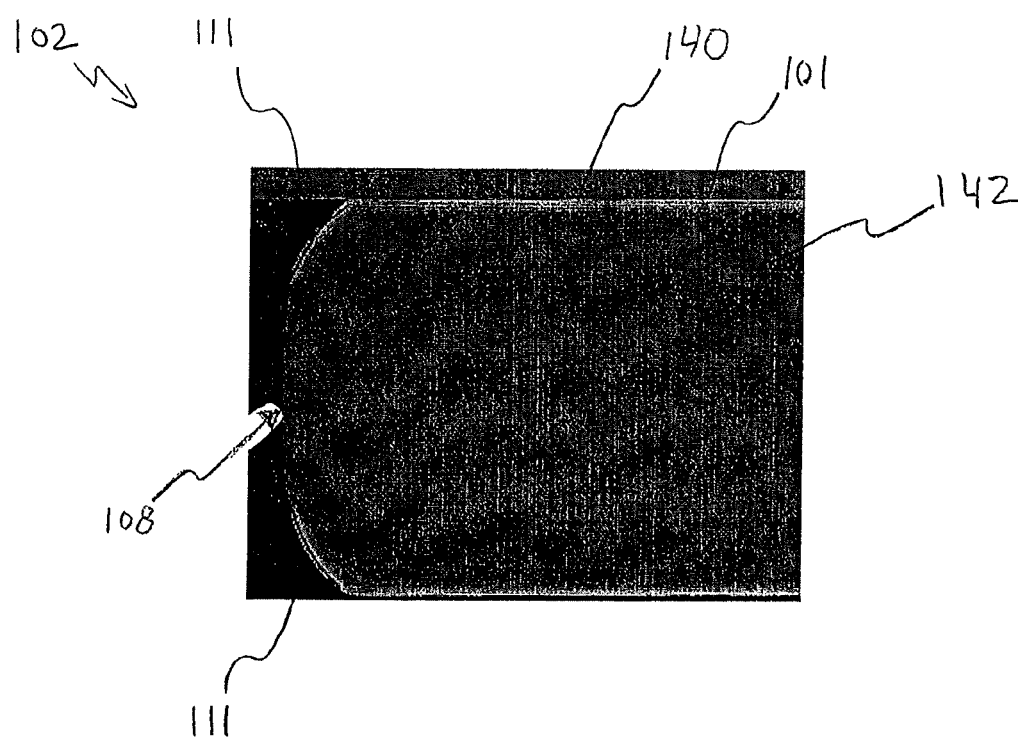
FIG. 7E depicts an x-ray map, cross sectional view of a separated strengthened glass article having grooves formed by laser cold ablation according to one or more embodiments shown and described herein.
Figure 7A:
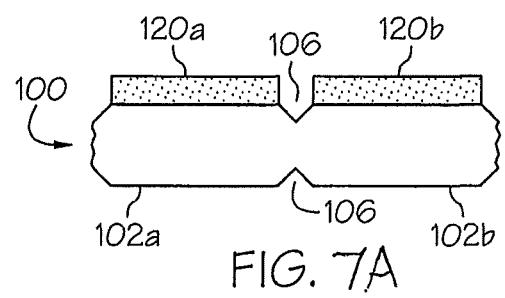
FIG. 7A schematically depicts a partial cross section of a glass substrate sheet having an optically-transparent and electrically-conductive coating applied thereto according to one or more embodiments shown and described herein.

Referring now to FIG. 7A, in some embodiments, the glass articles (e.g., glass articles 102a, 102b) of the strengthened glass substrate sheet 100 may have a thin film layer such as at least one touch sensor layer, applied on the ion-exchanged surface (e.g., thin film coating 120a, 120b). In one embodiment, the thin film layer 120 is selectively applied to the glass substrate sheet 100 in a predetermined pattern to enable touch screen functionality on the glass article 102 of the glass substrate sheet 100. For example, one or more layers of an electrically-conductive and optically-transparent material may be applied to the glass substrate sheet 100 in a predetermined pattern by first applying a masking agent to the glass substrate sheet 100 to define the pattern. Thereafter, the electrically-conductive and optically-transparent thin film coating material is applied to the glass substrate sheet 100 in the unmasked areas. In the embodiment shown in FIG. 7A, the electrically-conductive and optically-transparent material is applied to the glass substrate sheet 100 to define a plurality of touch-activated areas on the glass substrate sheet. However, it should be understood that the pattern of the electrically-conductive and optically-transparent material may be varied depending on the specific needs of the application in which the glass article 102 is to be employed. The electrically-conductive and optically-transparent material may be any material suitable for imparting touch screen functionality to the glass article 102 of the glass substrate sheet 100 including, without limitation, indium tin oxide, aluminum zinc oxide, conductive polymers, or similar conductive materials. The electrically-conductive and optically-transparent material may be applied to the glass substrate sheet 100 by electron beam deposition, sputtering, physical vapor deposition, spin coating or similar deposition techniques. It should be understood that materials other than electrically-conductive and optically transparent thin film may be utilized to form the one or more touch sensor layers.

Figure 7B:
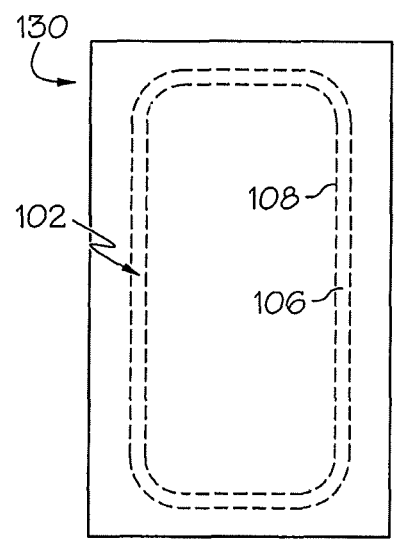
FIG. 7B schematically depicts a glass article cell separated from a strengthened glass substrate sheet according to one or more embodiments shown and described herein.
Figure 7C:
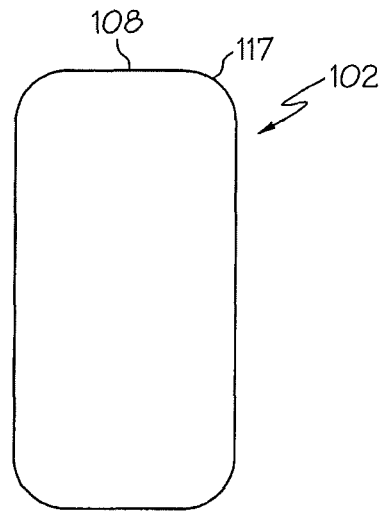
FIG. 7C schematically depicts a strengthened glass article separated from a strengthened glass substrate sheet according to one or more embodiments shown and described herein.

Referring now to FIGS. 1A, 7B and 7C, the glass article 102 may be separated from the glass substrate sheet 100 by severing the glass article 102 from the grooves 106 along the edge 108 of the glass article 102. In the embodiment illustrated in FIG. 7B, a larger glass article cell 130 may first be optionally separated from the strengthened glass substrate sheet 100. The glass article 102 may then be separated from the glass article cell 130. Alternatively, the glass article 102 may be separated directly from the glass substrate sheet 100 without first separating a glass article cell from the glass substrate sheet 100. Referring to FIG. 1A, optional grooves 109a-109d may be formed in the glass substrate sheet 100 to define a plurality of glass article cells 130a-130i having glass articles 102a-102i located therein. The glass substrate sheet 100 may be separated into the plurality of glass article cells 130a-130i for further separation into the strengthened glass articles 102a-102i.

Figure 7D:
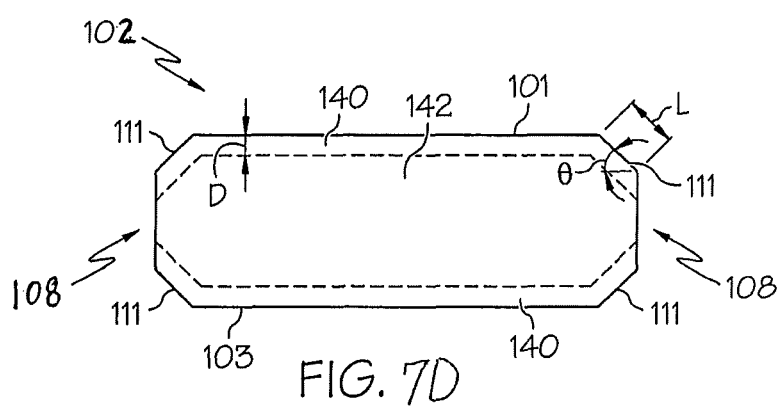
FIG. 7D schematically depicts a cross section of a strengthened glass article according to one or more embodiments shown and described herein.

The glass articles 102a-102i may be separated from the grooves 106a-106i utilizing one or more of a variety of glass separation techniques including, without limitation, mechanical scoring and breaking techniques, laser scribing and breaking techniques, laser through cutting, water jet cutting, etching, abrading the glass substrate sheet, and similar glass separation techniques. FIGS. 7C and 7D depict a glass article 102 separated from a glass substrate sheet. While the embodiment shown in FIG. 7C depicts a curved feature forming a corners 117 of the glass article 102, it should be understood that various other curved features may be formed in the edge 108 of the glass article 102. For example, the curved feature 117 may be formed along the edge 108 of the glass article 102 in a location other than the corner 117, such as when one or more curved features are formed in the edge 108 of the substrate along a length of the glass article 102. In one embodiment, the maximum radius of curvature of the curved feature is less than about 10 mm. In another embodiment, the maximum radius of curvature of the curved feature is 5 mm or less or even 2 mm or less. However, it should be understood that curved features having a maximum radius of greater than or equal to 10 mm may also be formed in the glass article 102.

In some embodiments, the edges of the glass article 102 may have residual glass material, such as a lip. Edge finishing, such as edge polishing, may be utilized to remove any residual glass material. Particularly, a lip may be present along the edges of the glass article 102 when U-shaped grooves are formed within glass substrate sheet 100 prior to separation. Use of a V-shaped grooves such as those depicted in FIGS. 1D and 1E, or curved walls as depicted in FIG. 3C may prevent the formation of a lip of residual glass material, thereby eliminating or minimizing edge finishing and are therefore preferred because edge finishing may result in the removal of the compressive layer at the edges.

FIG. 7D depicts a cross section of the strengthened glass article 102 depicted in FIG. 7C. In this embodiment, the grooves have been formed in the glass substrate sheet 100 such that the edges 108 of the strengthened glass article are formed with a chamfer portion 111. In the embodiments shown herein, the chamfer portion 111 has chamfer angle θ of about 45° with a hypotenuse having a length L from about 0.1 mm to about 0.2 mm. However, it should be understood that, in other embodiments (not shown), chamfers or bevels of different configurations and dimensions may be formed along the edges of the glass article 102.

The glass article 102 has been strengthened by the chemical strengthening process described above. A layer of compressive stress 140 extends from the top surface 101 and bottom surface 103 of the glass article 102 to a depth of layer D. Because the formation of grooves exposed at least a portion of the edges 108 of the glass article 102 to the ion exchange process, all or some portion of the edges 108 also have a compressive stress layer associated therewith, thereby providing a stronger edge than an edge of a glass article that was separated from a glass substrate sheet after chemical strengthening and without the formation of grooves as described above. As shown in FIG. 7D, the chamfer portion 111 of the edge has a layer of compressive stress associated therewith. By providing a very thin groove thickness t', it may be possible to achieve an edge that is fully strengthened (i.e., the compressive layer is located along the entire edge).

The compressive stress 140 is balanced by the development of a layer of central tension 142 at the center of the glass article 102. As depicted in FIG. 6B, the layer of compressive stress 140 extends into the glass article 102 from the portion of the perimeter that is exposed in the grooves 106 formed in the glass substrate sheet 100. FIG. 7D shows a layer of compressive stress 140 and a corresponding layer of central tension 142 in a glass article 102 having chamfer portions 111 formed in the edges 108.

Referring now to FIG. 7E, an x-ray map provides a cross sectional image of a glass article 102 that was separated using an ultra-short pulsed laser beam and strengthened by ion exchange as described above. As a non-limiting example, the glass material was a 1.1 mm thick Corning® Code 2317 glass substrate. V-shaped grooves were formed on both sides of the glass substrate sheet. The glass substrate sheet was then subjected to an ion-exchange bath as described above, resulting in a layer of compressive stress 140 having depth of layer of about 45 µm, which is illustrated by the lighter K-enriched regions at the surfaces. The glass substrate sheet was separated along the V-shaped groove by the application of force and resulted in a glass article 102 having a chamfered edge 108 with no residual lip portion. As shown in FIG. 7E, the compressive stress layer 140 is present at a portion of the chamfered edge 108, particularly at chamfer portions 111. The compressive stress layer 140 at the edge 108 of the glass article increases the strength of the edge. For thin glass substrate sheets (e.g., less than 500 µm, it is possible to create a fully ion exchanged region between the grooves by choosing a groove depth and obtain a fully ion exchanged edge after separation.

Figure 4C:
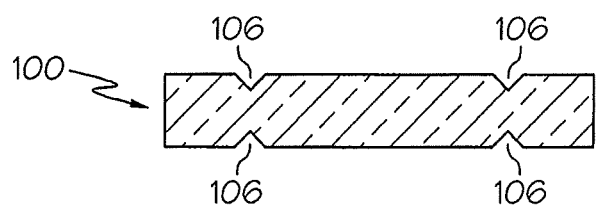
FIG. 4C schematically depicts the glass substrate sheet having grooves formed therein resulting from the hot pressing process schematically depicted in FIGS. 4A and 4B according to one or more embodiments shown and described herein.

As an example and not a limitation, glass substrate sheets were grooved using the hot pressing process described with respect to the example above. Molds were used to press straight-line grooves across 50×50×1 mm Corning® Code 2317 glass substrate sheets. The grooves were V-shaped grooves formed by pointed ridges and chamfered grooves formed by flat top ridges as depicted in FIGS. 4C and 2B, respectively. A 425 g piece of fused silica was placed on the top mold to provide the force, and the $N_2$-purged furnace was operated to a maximum temperature of about 810° C. Following the formation of the grooves, the glass substrate sheets were chemically strengthened by ion exchange. The glass articles were separated from the glass substrate sheet along the grooves using a femtosecond laser (a Ti sapphire laser operated at 800 nm wavelength, pulse width of 40 fs, power of 750 mW, at a frequency of 1 kHz). The V-shaped grooves provided a natural chamfer to the edge and produced no lip. The beveled grooves produced a slight lip along the edges of the glass articles.

The separated glass articles had a compressive stress of about 900 MPa and a depth of layer of about 34 µm. Due to the high temperature reached by the glass during hot pressing, the compressive stress and depth of layer obtained with the ion exchange schedule were different from that obtained on fusion drawn glass using the same ion exchange schedule. For example, using the same ion exchange schedule as that used on the hot pressed glass described above, a compressive stress of about 750 MPa and depth of layer of about 45 µm are typically obtained on as-drawn, non-heat treated glass. This difference may be overcome by re-heat treating the pre-grooved glass substrate sheets prior to ion-exchange, modifying the ion-exchange conditions, or using a hot-press grooving method that only raises the temperature of the groove area close to the softening point of the glass material while maintaining the surface of the glass at a temperature below the strain point of the glass material.

It is noted that in the various examples of the methods for forming grooves and separating glass articles from glass substrate sheets shown and described herein, multiple strengthened glass articles are depicted as being separated from a glass substrate sheet. However, it should be understood that the techniques described herein may be utilized to extract a single strengthened glass article from a single glass substrate sheet. It should also be understood that the methods described herein may be scaled to improve efficiency and economy.

It should now be understood that the methods described herein may be used to groove a glass substrate sheet to separate a strengthened glass article from the glass substrate sheet such that the strengthened glass substrate has the desired resistance to damage, particularly around the edge of the strengthened glass article. In some embodiments, the strengthened glass article may also comprise a coating material to enable touch functionality. The strengthened glass articles separated from strengthened glass substrate sheets using the methods described herein have improved resistance to failure, particularly failures emanating from the edges of the shaped glass article.

It will be apparent to those skilled in the art that various modifications and variations can be made to the embodiments described herein without departing from the spirit and scope of the claimed subject matter. Thus, it is intended that the specification cover the modifications and variations of the various embodiments described herein, provided such modification and variations come within the scope of the appended claims and their equivalents.

What is claimed is:

1. A method of separating a glass article from a glass substrate sheet, the method comprising:
    providing an un-strengthened glass substrate sheet;
    forming at least one groove on at least one surface of the un-strengthened glass substrate sheet, the at least one groove continuously extending around a perimeter of the glass article and extending partially through a thickness of the glass substrate sheet;
    strengthening the un-strengthened glass substrate sheet by an ion-exchange strengthening process; and
    separating the strengthened glass article from the glass substrate sheet along the at least one groove, wherein at least a portion of one or more edges of the glass article are under compressive stress.

2. The method of claim 1, further comprising:
    applying a protective coating to a surface of the un-strengthened glass substrate sheet prior to forming the at least one groove; and
    removing the protective coating from the surface of the glass substrate sheet after forming the at least one groove and prior to strengthening the un-strengthened glass substrate sheet.

3. The method of claim 1, further comprising applying a thin film layer to the glass substrate sheet after the glass substrate sheet is strengthened and before the glass article is separated from the glass substrate sheet.

4. The method of claim 3, wherein the thin film layer comprises at least one optically-transparent and electrically-conductive layer.

5. The method of claim 1, further comprising polishing one or more edges of the glass article to remove residual glass substrate material.

6. The method of claim 1, wherein:
    the at least one groove comprises a first groove on a first surface of the un-strengthened glass substrate sheet and a second groove on a second surface of the un-strengthened glass substrate sheet; and the second groove is opposite from the first groove such that the first and second grooves are aligned with one another.

7. The method of claim 1, wherein the at least one groove is substantially U-shaped in cross-section.

8. The method of claim 7, wherein the at least one groove has beveled or chamfered walls.

9. The method of claim 1, wherein the at least one groove is substantially V-shaped in cross-section.

10. The method of claim 1, wherein the at least one groove is formed by acid etching, application of a dicing saw, application of an end mill, application of a water jet, a hot pressing process, or combinations thereof.

11. The method of claim 1, wherein forming the at least one groove further comprises:
positioning the un-strengthened glass substrate sheet on a bottom mold;
positioning a top mold on the un-strengthened glass substrate sheet, wherein at least one of the top mold or the bottom mold comprises a ridge section configured to form the at least one groove;
applying a force to at least one of the top mold or the bottom mold;
heating the top mold, the bottom mold, and the un-strengthened glass substrate sheet;
cooling the top mold, the bottom mold, and the un-strengthened glass substrate sheet; and
removing the un-strengthened glass substrate sheet from the top and bottom molds.

12. The method of claim 11, wherein:
the force is applied to the top mold by placing a weight on the top mold;
heating the top mold, the bottom mold, and the un-strengthened glass substrate sheet comprises:
placing the top mold, the bottom mold, and the un-strengthened glass substrate sheet into an $N_2$-purged furnace;
operating the $N_2$-purged furnace to generate thermal energy at a rate of 10° C. per minute to a maximum temperature of about 25° C. below a softening point of the glass substrate sheet; and
operating the $N_2$-purged furnace at the maximum temperature for about 10 minutes; and
the top mold, the bottom mold, and the un-strenathened glass substrate sheet is cooled at a furnace cooling rate until the un-strengthened glass substrate sheet is at room temperature.

13. The method of claim 1, wherein the at least one groove is substantially V-shaped in cross-section.

14. The method of claim 1, wherein:
the at least one groove comprises a first groove on a first surface of the un-strengthened glass substrate sheet and a second groove on a second surface of the un-strengthened glass substrate sheet; and
the second groove is opposite from the first groove such that the first and second grooves are aligned with one another.

15. A method separating a glass article from a glass substrate sheet, the method comprising:
positioning an un-strengthened glass substrate sheet on a bottom mold;
positioning a top mold on the un-strengthened glass substrate sheet, wherein at least one of the top mold or the bottom mold comprises a ridge section configured to form the at least one groove;
applying a force to at least one of the top mold or the bottom mold;
heating the top mold, the bottom mold, and the un-strenathened glass substrate sheet;
cooling the top mold, the bottom mold, and the un-strengthened glass substrate sheet;
removing the un-strengthened glass substrate sheet from the top and bottom molds, wherein the glass substrate sheet comprises at least one V-shaped groove on at least one surface of the un-strengthened glass substrate sheet, the at least one groove continuously extending around a perimeter of the glass article and extending partially through a thickness of the un-strengthened glass substrate sheet;
strengthening the un-strengthened glass substrate sheet by an ion-exchange strengthening process; and
separating the strengthened glass article from the glass substrate sheet along the at least one groove, wherein at least a portion of one or more edges of the glass article are under compressive stress.

16. The method of claim 15, further comprising:
applying a protective coating to a surface of the un-strengthened glass substrate sheet prior to forming the at least one groove; and
removing the protective coating from the surface of the un-strengthened glass substrate sheet after forming the at least one groove and prior to strengthening the un-strengthened glass substrate sheet.

17. The method of claim 15, further comprising applying an optically-transparent and electrically-conductive coating to the glass substrate sheet after the un-strengthened glass substrate sheet is strengthened and before the glass article is separated from the glass substrate sheet.

18. The method of claim 15, wherein:
the at least one groove comprises a first groove on a first surface of the un-strengthened glass substrate sheet and a second groove on a second surface of the un-strengthened glass substrate sheet; and
the second groove is opposite from the first groove such that the first and second grooves are aligned with one another.

19. The method of claim 15, wherein:
the force is applied to the top mold by placing a weight on the top mold;
heating the top mold, the bottom mold, and the un-strengthened glass substrate sheet comprises:
placing the top mold, the bottom mold, and the un-strengthened glass substrate sheet into an $N_2$-purged furnace;
operating the $N_2$-purged furnace to generate thermal energy at a rate of 10° C. per minute to a maximum temperature of about 25° C. below a softening point of the glass substrate sheet; and
operating the $N_2$-purged furnace at the maximum temperature for about 10 minutes; and
the top mold, the bottom mold, and the un-strengthened glass substrate sheet is cooled at a furnace cooling rate until the un-strengthened glass substrate sheet is at room temperature.

20. A method of separating a glass article from a glass substrate sheet, the method comprising:
focusing a laser beam on at least one surface of an un-strengthened glass substrate sheet;
translating the laser beam on the surface of the un-strengthened glass substrate sheet along a desired groove line to form at least one groove on at least one surface of the un-strengthened glass substrate sheet, the at least one groove extending partially through a thickness of the glass substrate sheet along the desired groove line;

the at least one groove continuously extending around a perimeter of the class article;

strengthening the un-strengthened glass substrate sheet by an ion-exchange strengthening process; and separating the strengthened glass article from the glass substrate sheet along the at least one groove, wherein at least a portion of one or more edges of the glass article are under compressive stress.

21. The method of claim 20 wherein the laser beam has a wavelength that is within a spectral region of transparency of the glass substrate sheet.

22. The method of claim 20 wherein the laser beam comprises a pulsed laser beam having pulse widths that are less than about 100 fs.

23. The method of claim 20 wherein the laser beam comprises an asymmetrical intensity distribution at the surface of the glass substrate sheet.

24. The method of claim 23 wherein the asymmetrical intensity distribution corresponds to a desired groove shape.

25. The method of claim 20 wherein the laser beam is focused by:

focusing the laser beam with a first cylindrical lens having a first focal length; and focusing the laser beam with a second cylindrical lens having a second focal length, wherein the first focal length is different from the second focal length.

\* \* \* \* \*